(12) United States Patent
Kim et al.

(10) Patent No.: US 8,598,581 B2
(45) Date of Patent: Dec. 3, 2013

(54) THIN FILM TRANSISTOR SUBSTRATE AND METHOD FOR MANUFACTURING THE SAME

(75) Inventors: Jang-Soo Kim, Yongin-Si (KR);
Jae-Hyoung Youn, Seoul (KR);
Sang-Soo Kim, Seoul (KR); Dong-Gyu Kim, Yongin-si (KR)

(73) Assignee: Samsung Display Co., Ltd. (KR)

( * ) Notice: Subject to any disclaimer, the term of this patent is extended or adjusted under 35 U.S.C. 154(b) by 502 days.

(21) Appl. No.: 12/434,907

(22) Filed: May 4, 2009

(65) Prior Publication Data
US 2010/0019246 A1    Jan. 28, 2010

(30) Foreign Application Priority Data
Jul. 25, 2008    (KR) .................. 10-2008-0072704

(51) Int. Cl.
*H01L 33/00*    (2010.01)

(52) U.S. Cl.
USPC ............ 257/59; 257/72; 257/88; 257/98; 438/30; 438/34; 438/152; 438/158

(58) Field of Classification Search
USPC ............ 438/30, 34, 152, 158; 257/59, 72, 88, 257/98
See application file for complete search history.

(56) References Cited

U.S. PATENT DOCUMENTS

| | | | | |
|---|---|---|---|---|
| 6,656,776 B2 * | 12/2003 | Kim et al. | | 438/153 |
| 6,917,394 B2 | 7/2005 | Song et al. | | |
| 7,804,093 B2 * | 9/2010 | Kim et al. | | 257/59 |
| 2003/0232456 A1 * | 12/2003 | Yang et al. | | 438/30 |
| 2004/0195574 A1 * | 10/2004 | Ahn et al. | | 257/72 |
| 2005/0094079 A1 * | 5/2005 | Yoo et al. | | 349/141 |
| 2005/0264741 A1 * | 12/2005 | Kim | | 349/139 |
| 2006/0003479 A1 * | 1/2006 | Park et al. | | 438/30 |
| 2006/0146254 A1 * | 7/2006 | Kim | | 349/141 |
| 2006/0250536 A1 | 11/2006 | Kim | | |
| 2007/0117238 A1 * | 5/2007 | Oh et al. | | 438/30 |
| 2007/0139591 A1 | 6/2007 | Kim | | |
| 2007/0262312 A1 * | 11/2007 | Liu et al. | | 257/72 |

(Continued)

FOREIGN PATENT DOCUMENTS

| | | |
|---|---|---|
| JP | 10-206888 | 8/1998 |
| JP | 2002131735 A | 5/2002 |

(Continued)

*Primary Examiner* — Zandra Smith
*Assistant Examiner* — Toniae Thomas
(74) *Attorney, Agent, or Firm* — Cantor Colburn LLP

(57) ABSTRACT

A method for manufacturing a thin film transistor array panel includes; forming a gate line including a gate electrode and a height increasing member on a substrate, forming a gate insulating layer on the gate line and the height increasing member, forming a semiconductor, a data line including a source electrode, and a drain electrode facing the source electrode and overlapping at least a portion of the height increasing member on the gate insulating layer, forming a first insulating layer on the gate insulating layer, a data line and the drain electrode, forming a light-blocking member on a portion of the first insulating layer corresponding to the gate line and the data line, forming a color filter in an area bound by the light-blocking member, forming a second insulating layer on the light-blocking member and the color filter, and patterning the second insulating layer, the light-blocking member or the color filter, and the first insulating layer to form a contact hole exposing a portion of the drain electrode aligned with the height increasing member.

27 Claims, 12 Drawing Sheets

(56) References Cited

U.S. PATENT DOCUMENTS

| | | | |
|---|---|---|---|
| 2008/0049176 A1* | 2/2008 | Kim et al. | 349/114 |
| 2008/0068537 A1* | 3/2008 | Lee et al. | 349/106 |
| 2008/0113461 A1* | 5/2008 | Tung et al. | 438/30 |
| 2009/0152561 A1* | 6/2009 | Yoon et al. | 257/72 |
| 2010/0001276 A1* | 1/2010 | Kim et al. | 257/59 |

FOREIGN PATENT DOCUMENTS

| | | |
|---|---|---|
| JP | 2002-350886 | 12/2002 |
| JP | 2002-350887 | 12/2002 |
| JP | 2002350897 A | 12/2002 |
| JP | 2003107445 A | 4/2003 |
| JP | 2005309147 A | 11/2005 |
| JP | 2007139948 A | 6/2007 |
| JP | 2007140516 A | 6/2007 |
| KR | 10-2002-0072648 | 9/2002 |
| KR | 10-2005-0068457 | 7/2005 |
| KR | 10-2006-0041746 | 5/2006 |
| KR | 10-2006-0102173 | 9/2006 |
| KR | 10-2007-0071296 | 7/2007 |

* cited by examiner

THIN FILM TRANSISTOR SUBSTRATE AND METHOD FOR MANUFACTURING THE SAME

This application claims priority to Korean Patent Application No. 10-2008-0072704, filed on Jul. 25, 2008, and all the benefits accruing therefrom under 35 U.S.C. §119, the contents of which in its entirety are herein incorporated by reference.

BACKGROUND OF THE INVENTION (a) Field of the Invention

The present invention relates to a thin film transistor array panel for a display device. More particularly, the present invention relates to a thin film transistor array panel including a color filter or a light-blocking member.

(b) Description of the Related Art

A liquid crystal display ("LCD") is one of the most commonly used flat panel displays, and it includes two substrates with electrodes formed thereon and a liquid crystal layer interposed between the two substrates. In the LCD, a voltage is applied to the electrodes to realign liquid crystal molecules of the liquid crystal layer to thereby regulate the transmittance of light passing through the liquid crystal layer.

Among the various types of LCDs, an LCD having a structure in which field generating electrodes are respectively formed on two oppositely disposed display panels is widely used. Among the two display panels, a plurality of pixel electrodes and thin film transistors are arranged in a matrix format on one display panel (hereinafter, referred to as "a thin film transistor array panel"), and color filters of red, green, and blue are formed on the other display panel and one common electrode covers the entire surface of the other display panel (hereinafter, referred to as "a common electrode panel").

However, in the above described LCD, the pixel electrodes and the color filters are disposed on different display panels such that it is difficult to align the pixel electrodes and the color filters to each other, thereby generating an alignment error.

To solve this problem, a color filter on array ("CoA") structure in which the pixel electrode and the color filter are formed on the same display panel has been developed. In this case, a contact hole for connecting the pixel electrode and the thin film transistor is formed in the color filter, and the contact hole is formed by dry-etching the color filter. However the process is not easy and may lead to assembly errors and increased manufacturing costs.

BRIEF SUMMARY OF THE INVENTION

The present invention provides an easy dry-etching process for forming a contact for connecting a pixel electrode and a thin film transistor in the structure of a thin film transistor array panel including a color filter.

An exemplary manufacturing method of a thin film transistor array panel according to the present invention includes; forming a gate line including a gate electrode and a height increasing member on a first substrate, forming a gate insulating layer on the gate line and the height increasing member, forming a semiconductor, a data line including a source electrode, and a drain electrode facing the source electrode and overlapping at least a portion of the height increasing member on the gate insulating layer, forming a first insulating layer on the gate insulating layer, the data line and the drain electrode, forming a light-blocking member on a portion of the first insulating layer corresponding to the gate line and the data line, forming a color filter in an area bound by the light-blocking member, forming a second insulating layer on the light-blocking member and the color filter, patterning the second insulating layer, one of the light-blocking member and the color filter, and the first insulating layer to form a contact hole exposing a portion of the drain electrode aligned with the height increasing member, and forming a pixel electrode connected to the drain electrode through the contact hole on the second insulating layer.

In one exemplary embodiment, the patterning of the second insulating layer, one of the light-blocking member and the color filter, and the first insulating layer to form a contact hole exposing the portion of the drain electrode aligned with the height increasing member may include; forming a photosensitive film pattern on the second insulating layer, etching the second insulating layer using the photosensitive film pattern as a mask to form an upper portion of the contact hole, and etching the one of the light-blocking member and the color filter and the first insulating layer using the second insulating layer having the upper portion of the contact hole as a mask.

In one exemplary embodiment, the etching the second insulating layer and the etching the one of the light-blocking member and the color filter may be executed by dry etching.

In one exemplary embodiment, the forming of the semiconductor, the data line including the source electrode, and the drain electrode facing the source electrode and overlapping at least the portion of the height increasing member on the gate insulating layer may include etching the gate insulating layer that is not covered by the semiconductor, the data line, and the drain electrode to reduce the thickness of the gate insulating layer.

In one exemplary embodiment, the forming of the semiconductor, the data line including the source electrode, and the drain electrode facing the source electrode and overlapping at least the portion of the height increasing member on the gate insulating layer includes; sequentially depositing a semiconductor layer and a data conductive layer on the gate insulating layer, forming a photosensitive film pattern including a first portion and a second portion which is thicker than the first portion on the data conductive layer using a slit mask, etching the semiconductor layer and the data conductive layer using the photosensitive film pattern as a mask, etching the gate insulating layer using the photosensitive film pattern as a mask to reduce the thickness of the gate insulating layer, ashing to remove the first portion of the photosensitive film pattern, and etching the portion of the data conductive layer and the semiconductor layer exposed by the removal of the first portion.

In one exemplary embodiment, a thin film transistor array panel includes; a substrate, a gate line including a gate electrode and a height increasing member disposed on the first substrate, a gate insulating layer disposed on the gate line and the height increasing member, a semiconductor disposed on the gate insulating layer, a data line including a source electrode and a drain electrode facing the source electrode and overlapping at least a portion of the height increasing member disposed on the semiconductor, a first insulating layer disposed on the gate insulating layer, the data line, and the drain electrode, a light-blocking member disposed on a portion of the first insulating layer corresponding the gate line and the data line, a color filter disposed in an area defined by the light-blocking member, a second insulating layer disposed on the light-blocking member and the color filter, and a pixel electrode disposed on the second insulating layer and connected to the drain electrode through a contact hole in the second insulating layer, one of the light-blocking member and the color filter, and the first insulating layer, wherein the contact hole is aligned with the height increasing member.

In one exemplary embodiment, a thickness of a first portion of the gate insulating layer which is covered by the semiconductor, the data line, and the drain electrode may be greater than a thickness of a second portion of the gate insulating layer which is not covered by the semiconductor, the data line, and the drain electrode.

In one exemplary embodiment, the height increasing member may be totally overlapped by the drain electrode.

An exemplary embodiment of a method of manufacturing a thin film transistor array panel according to the present invention includes; forming a gate line including a gate electrode and a height increasing member on a substrate, forming a gate insulating layer on the gate line and the height increasing member, forming a semiconductor, a data line including a source electrode, and a drain electrode facing the source electrode and overlapping at least a portion of the height increasing member on the gate insulating layer, forming a first insulating layer on the gate insulating layer, the data line and the drain electrode, forming a partition on a portion of the first insulating layer corresponding to the gate line and the data line, forming a color filter in an area bound by the partition, forming a second insulating layer on the partition and the color filter, patterning the second insulating layer, one of the partition and the color filter, and the first insulating layer to form a contact hole exposing a portion of the drain electrode aligned with the height increasing member, forming a pixel electrode connected to the drain electrode through the contact hole on the second insulating layer; and forming a light-blocking member on the second insulating layer.

In one exemplary embodiment, the patterning of the second insulating layer, one of the partition and the color filter, and the first insulating layer to form a contact hole exposing the portion of the drain electrode aligned with the height increasing member may include; forming a photosensitive film pattern on the second insulating layer, etching the second insulating layer using the photosensitive film pattern as a mask to form an upper portion of the contact hole, and etching the one of the light-blocking member and the color filter and the first insulating layer using the second insulating layer having the upper portion of the contact hole as a mask.

In one exemplary embodiment, the etching the second insulating layer and the etching the one of the light-blocking member and the color filter may be executed by dry etching.

In one exemplary embodiment, the method may further include forming a spacer on the second insulating layer after forming the light-blocking member on the second insulating layer.

In one exemplary embodiment, the forming of the semiconductor, the data line including the source electrode, and the drain electrode facing the source electrode and overlapping at least the portion of the height increasing member on the gate insulating layer may include; etching the gate insulating layer which is not covered by the semiconductor, the data line, and the drain electrode to reduce the thickness of the gate insulating layer.

In one exemplary embodiment, the forming of the semiconductor, the data line including the source electrode, and the drain electrode facing the source electrode and overlapping at least the portion of the height increasing member on the gate insulating layer may include; sequentially depositing a semiconductor layer and a data conductive layer on the gate insulating layer, forming a photosensitive film pattern having a first portion, a second portion having a greater thickness than the first portion on the data conductive layer using a slit mask, etching the semiconductor layer and the data conductive layer using the photosensitive film pattern as a mask, etching the gate insulating layer using the photosensitive film pattern as a mask to reduce the thickness of the gate insulating layer, ashing the photosensitive film pattern to remove the first portion, and etching the exposed portion of the data conductive layer and the semiconductor layer through the removal of the first portion.

An exemplary embodiment of a thin film transistor array panel according to the present invention includes; a substrate, a gate line including a gate electrode and a height increasing member disposed on the first substrate, a gate insulating layer disposed on the gate line, a semiconductor disposed on the gate insulating layer, a data line including a source electrode, and a drain electrode facing the source electrode and overlapping at least a portion of the height increasing member disposed on the semiconductor, a first insulating layer disposed on the gate insulating layer, the data line, and the drain electrode, a partition disposed on a portion of the first insulating layer corresponding to the gate line and the data line, a color filter disposed in an area bound by the partition, a second insulating layer disposed on the partition and the color filter, and a pixel electrode disposed on the second insulating layer and connected to the drain electrode through a contact hole in the second insulating layer, one of the partition and the color filter, and the first insulating layer, a light-blocking member disposed on a portion of the insulating layer corresponding to the gate line and the data line, wherein the contact hole is aligned with the height increasing member.

In one exemplary embodiment, a spacer disposed on the light-blocking member may be further included.

In one exemplary embodiment, a thickness of a first portion of the gate insulating layer which is covered by the semiconductor, the data line, and the drain electrode may be greater than a thickness of a portion of the gate insulating layer which is not covered by the semiconductor, the data line, and the drain electrode.

In one exemplary embodiment, the height increasing member may be disposed in a region totally overlapped by the drain electrode. According to an exemplary embodiment of the present invention, the height increasing member is formed under the contact hole for the contact between the pixel electrode and the thin film transistor such that the length of the contact hole is reduced, thereby easily executing the dry-etching process for the forming of the contact hole.

DETAILED DESCRIPTION OF THE INVENTION

Figure 1:
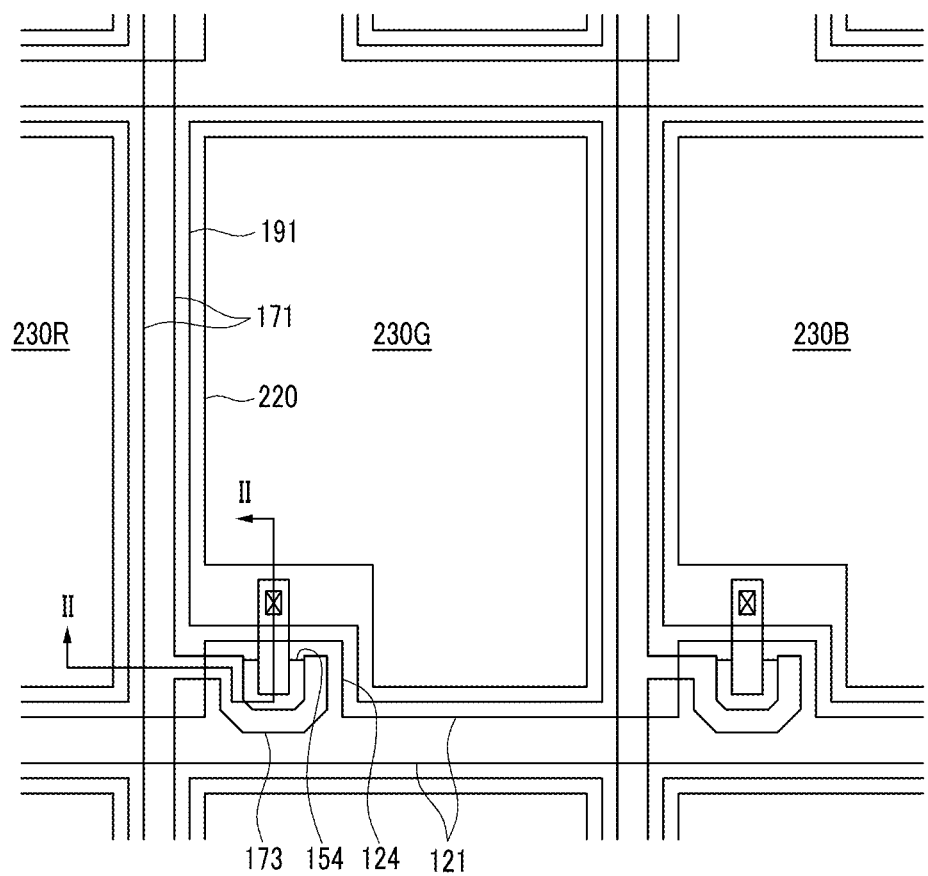
FIG. 1 is a top plan layout view of a first exemplary embodiment of a liquid crystal display ("LCD") according to the present invention.

The invention now will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals in the drawings denote like elements. In the drawings, the thicknesses of layers and regions are exaggerated for clarity.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

<First Exemplary Embodiment>

Now, a first exemplary embodiment of a liquid crystal display ("LCD") according to the present invention will be described with reference to FIG. 1 and FIG. 2. FIG. 1 is a top plan layout view of the first exemplary embodiment of an LCD according to the present invention, and FIG. 2 is a cross-sectional view of the first exemplary embodiment of an LCD shown in FIG. 1 taken along line II-II.

Figure 2:
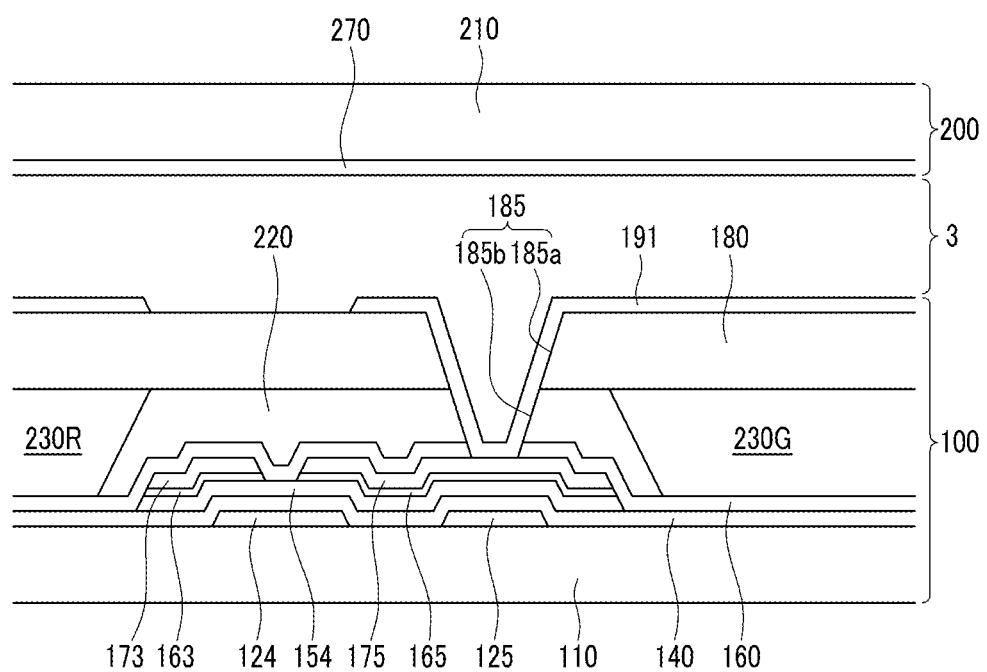
FIG. 2 is a cross-sectional view of the first exemplary embodiment of an LCD shown in FIG. 1 taken along line II-II.

Referring to FIG. 1 to FIG. 2, an LCD according to the present exemplary embodiment includes a thin film transistor ("TFT") array panel 100 and a common electrode panel 200 facing each other, and a liquid crystal layer 3 interposed between two display panels 100 and 200. Firstly, the TFT array panel 100 will be described.

A plurality of gate lines 121 including gate electrodes 124, a height increasing member 125, a gate insulating layer 140, a plurality of semiconductors 154, a plurality of ohmic contacts 163 and 165, and a plurality of data lines 171 and a plurality of drain electrodes 175 are formed on an insulation substrate 110. Exemplary embodiments of the insulation substrate may be made of a material such as transparent glass or plastic, or other materials having similar characteristics.

The gate lines 121 transmit gate signals and extend in a transverse direction. The height increasing member 125 is overlapped by at least a portion of the drain electrode 175 as will be described later, and is disposed under a contact hole 185 for connecting a pixel electrode 191 and the drain electrode 175 to each other.

The data lines 171 transmit data signals and extend in a longitudinal direction, thereby being disposed substantially perpendicular to the gate lines 121. Each data line 171 includes a plurality of source electrodes 173 extending toward the gate electrodes 124. The drain electrodes 175 are separated from the data lines 171 and opposite to the source electrodes 173 with respect to the gate electrodes 124.

The semiconductors 154 are disposed on the gate electrodes 124, and overlying ohmic contacts 163 and 165 are disposed between the semiconductors 154 and the data lines 171 and drain electrodes 175, thereby reducing resistance therebetween. In one exemplary embodiment, the ohmic contacts 163 and 165 are disposed only between the semiconductors 154 and the data lines 171 and drain electrodes 175.

A gate electrode 124, a source electrode 173, and a drain electrode 175, along with a semiconductor 154, form an individual TFT, and a channel of the TFT is formed in the semiconductor 154 between the source electrode 173 and the drain electrode 175.

A blocking layer 160, exemplary embodiments of which may be made of silicon nitride or silicon oxide, is formed on the data lines 171 and the drain electrodes 175. The blocking layer 160 may prevent a solution used for forming color filters 230R, 230G, and 230B, as will be described in more detail below, from flowing into the semiconductors 154 exposed between the source electrodes 173 and the drain electrodes 175.

A light-blocking member 220 is disposed on a portion of the TFT array panel 100 corresponding to the gate line 121, the data line 171, and the TFT and is formed on the blocking layer 160, and the color filters 230R, 230G, and 230B, are formed in a pixel area corresponding to the light-blocking member 220. The light-blocking member 220 may also be referred to as a black matrix.

A passivation layer 180 is formed on the color filters 230R, 230G, and 230B. The passivation layer 180 prevents the color filters 230R, 230G, and 230B from separating from the underlying layers and prevents a chemical solution such an etchant from flowing into the color filters 230R, 230G, and 230B.

The passivation layer 180, the light-blocking member 220, and the blocking layer 160 have contact holes 185 including a first contact hole 185a formed in the passivation layer 180, a second contact hole 185b formed in the light-blocking member 220 and the blocking layer 160. The contact holes 185 expose the drain electrode 175 therethrough.

A plurality of pixel electrodes 191 are formed on the passivation layer 180, and connected to the drain electrodes 175 through the contact holes 185.

The height increasing member 125 is disposed under the contact hole 185 such that the length of the contact hole 185 is reduced by the height of the height increasing member 125. Particularly, the length of the contact hole 185b formed in the light-blocking member 220 and blocking layer 160 is reduced. Also, in one exemplary embodiment, the height increasing member 125 may be disposed in a region totally enclosed by the boundary of the drain electrode 175.

The common electrode panel 200 includes a common electrode 270 facing the TFT array panel 100 and formed on a substrate 210. However, alternative exemplary embodiments include configurations wherein the common electrode 270 may be formed in the TFT array panel 100.

A liquid crystal layer 3 is disposed between the common electrode panel 200 and the TFT array panel 100.

Next, an exemplary embodiment of a method of manufacturing the first exemplary embodiment of an LCD shown in FIG. 1 and FIG. 2 will be described with reference to FIG. 3 to FIG. 9 as well as FIG. 1 and FIG. 2.

FIG. 3 to FIG. 9 are cross-sectional views sequentially showing an exemplary embodiment of the manufacturing process of the first exemplary embodiment of an LCD shown in FIG. 1 and FIG. 2.

Figure 3:
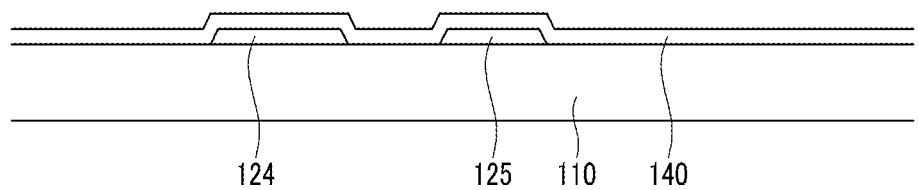
FIG. 3 to FIG. 9 are cross-sectional views sequentially showing an exemplary embodiment of the manufacturing process of the first exemplary embodiment of an LCD shown in FIG. 1 and FIG. 2.

Firstly, as shown in FIGS. 1 and 3, a gate line 121 including a gate electrode 124 and a height increasing member 125 are formed on an insulation substrate 110. A gate insulating layer 140 is formed on the whole surface of the insulation substrate 110 including the gate line 121 and the height increasing member 125. Also, in one exemplary embodiment, the height increasing member 125 may be formed to be disposed in the region enclosed by the boundary of a drain electrode 175 that will be formed later.

Figure 4:
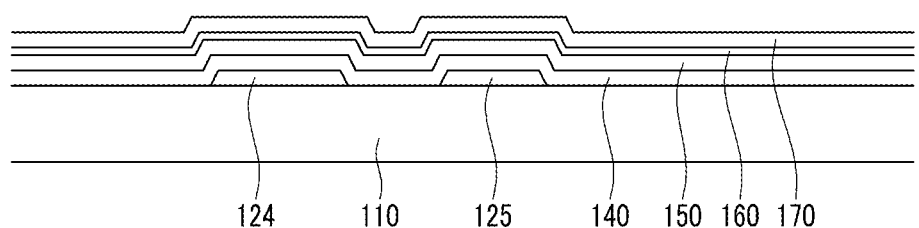
Figure 5:
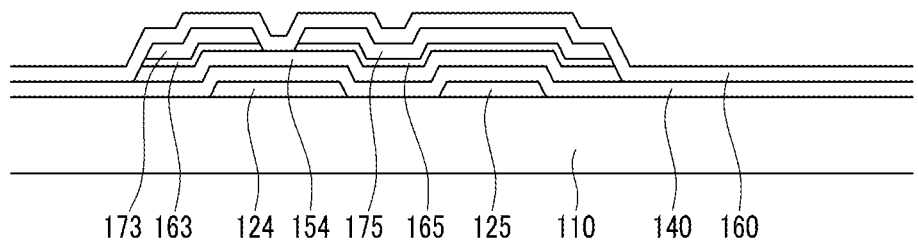

Next, as shown in FIG. 4 and FIG. 5, a semiconductor layer 150, an ohmic contact layer 161, and a data conductive layer 170 are sequentially formed on the gate insulating layer 140.

In one exemplary embodiment, a photosensitive film (not shown) is coated on the data conductive layer 170, and is exposed and developed to form a photosensitive film pattern having different thicknesses by using a slit mask (not shown). Next, the data conductive layer 170, the ohmic contact layer 161, and the semiconductor layer 150 are first etched using the photosensitive film pattern as a mask, and the data conductive layer 170 is secondly etched to form a data line 171 including a source electrode 173 and a drain electrode 175. Next, an ohmic contact layer 161 exposed between the source electrode 173 and the drain electrode 175 is removed to form ohmic contacts 163 and 165. Alternative exemplary embodiments include configurations wherein the data line 171, the source electrode 173, the drain electrode 175 and the ohmic contacts 163 and 165 are formed using alternative methods, e.g., the use of additional masks in addition to the slit mask described above.

A blocking layer 160 is formed on substantially the entire surface including the data line 171, the drain electrode 175, and the gate insulating layer 140.

Figure 6:
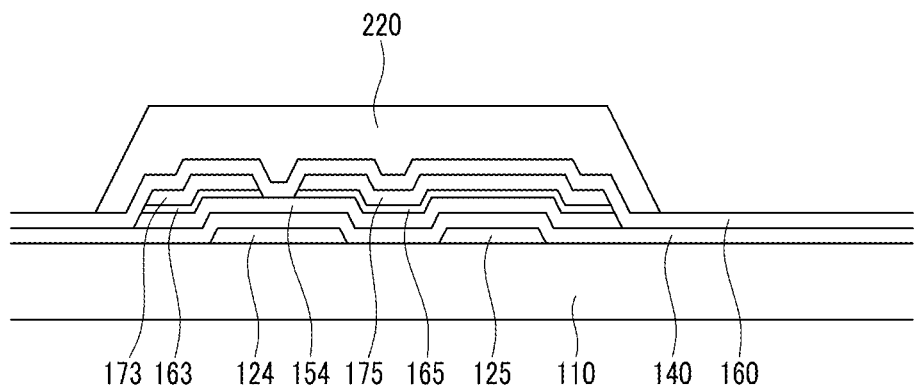

Next, as shown in FIG. 6, a light-blocking member 220 is formed on a region corresponding to the gate line 121 and the data line 171.

Figure 7:
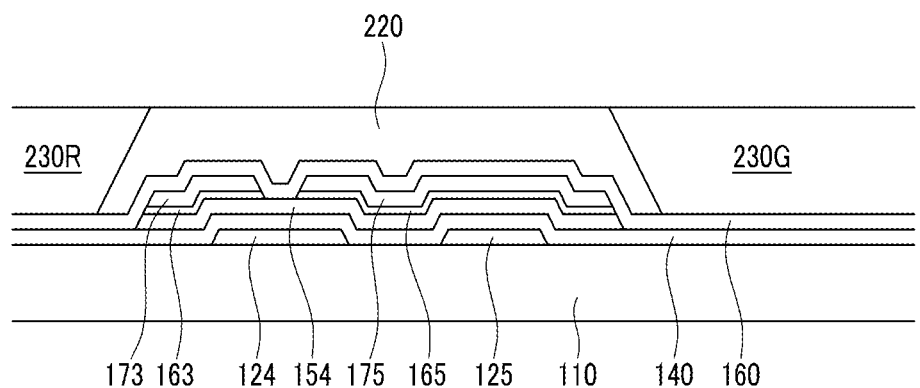

Next, as shown in FIG. 7, color filters 230R, 230G, and 230B are formed in each region defined by the light-blocking member 220. In one exemplary embodiment, the color filters 230R, 230G, and 230B may be formed by Inkjet printing, wherein a solution for forming a color filter is dripped in the regions defined by the light-blocking member 220 via an Inkjet head. Next, the color filter solution is dried.

Figure 8:
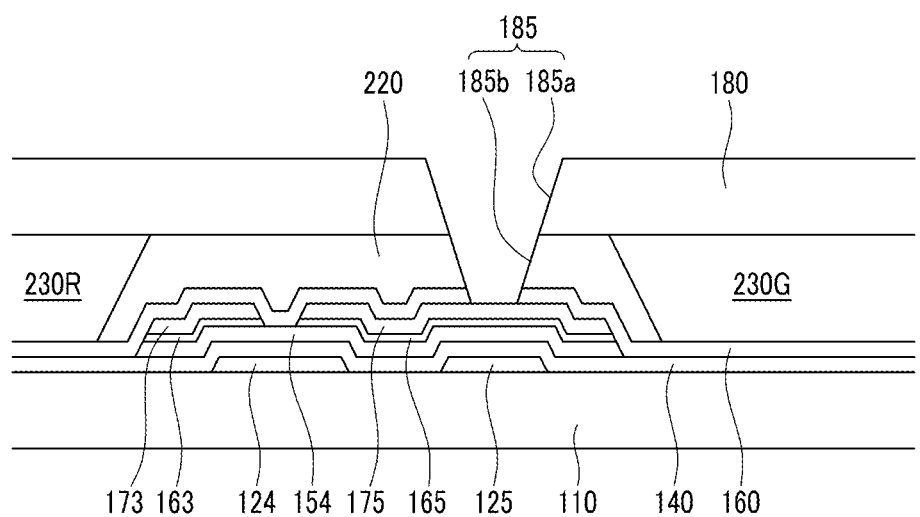

Next, as shown in FIG. 8, a passivation layer 180 is formed on the color filters 230R, 230G, and 230B and the light-blocking member 220. Subsequently, the passivation layer 180, the light-blocking member 220, and the blocking layer 160 are patterned to form a contact hole 185 exposing the drain electrode 175.

In one exemplary embodiment of forming the contact hole 185, a photosensitive film (not shown) is coated on the passivation layer 180 and is patterned to form a photosensitive film pattern using a mask (not shown). Next, the passivation layer 180 is dry-etched using the photosensitive film pattern as a mask to form the first contact hole 185a. Next, the light-blocking member 220 and the blocking layer 160 are dry-etched using the passivation layer 180 having the first contact hole 185a to form the second contact hole 185b.

Here, the length of the contact hole 185 is reduced by the thickness of the height increasing member 125 disposed under the contact hole 185. Particularly, the length of the second contact hole 185b is reduced by the thickness of the height increasing member 125.

Accordingly, the thickness for the dry-etching is reduced such that the dry etching may be more easily executed, thereby improving productivity.

Figure 9:
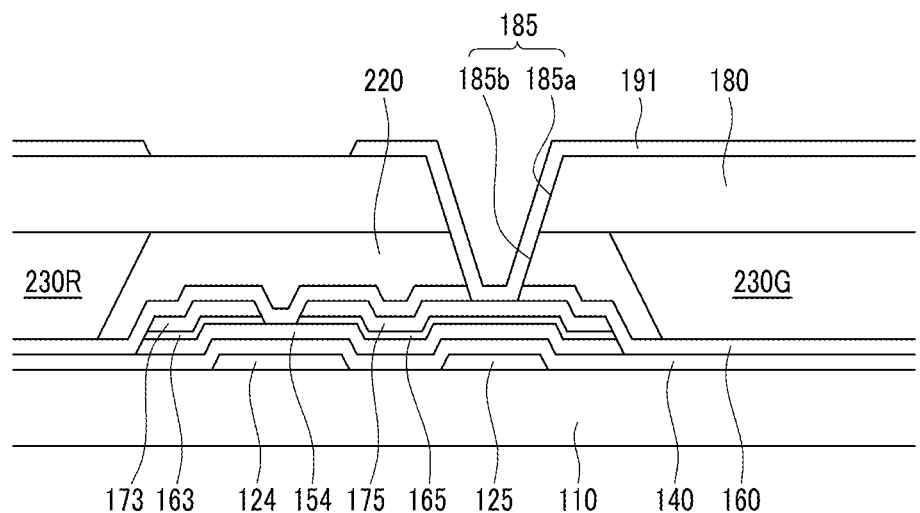

Next, as shown in FIG. 9, a pixel electrode 191 connected to the drain electrode 175 though the contact hole 85 is formed on the passivation layer 180. Another advantage to the inclusion of the height increasing member 125 is that it reduces the vertical distance covered by the pixel electrode 191 in the contact hole 185, thereby reducing or eliminating manufacturing defects caused by gaps in the pixel electrode 191.

In the common electrode panel 200, a common electrode 270 is formed on an insulation substrate 210.

Next, in one exemplary embodiment, liquid crystal is dripped on one of the TFT array panel 100 and the common electrode panel 200, and then the two display panels 100 and 200 are assembled. Alternative exemplary embodiments include configurations wherein the liquid crystal is deposited between the assembled display panels 100 and 200.

Figure 10:
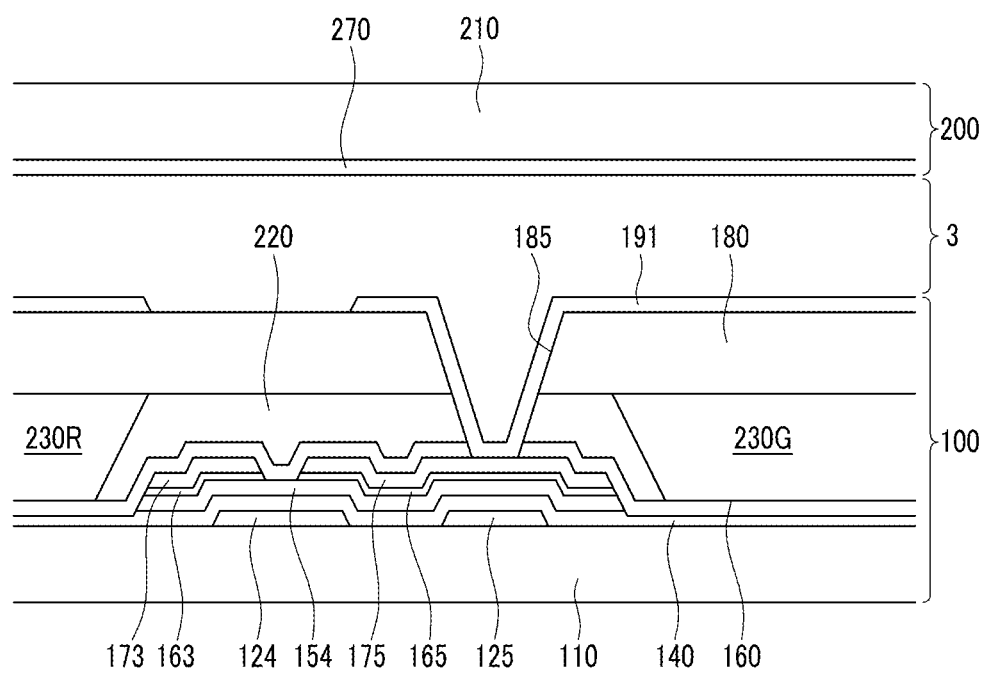
FIG. 10 is another cross-sectional view of the first exemplary embodiment of an LCD according to the present invention.

Also, as shown in FIG. 10, exemplary embodiments include configurations wherein the thickness of the gate insulating layer 140 may not be uniform. That is, the thickness of a portion of the gate insulating layer 140 covered by the semiconductor 154, the data line 171, and the drain electrode 175 may be greater than at other areas. Accordingly, the length of the contact hole 185 may be further reduced by the difference of the thickness of the gate insulating layer 140.

In such an exemplary embodiment, the difference of the thickness of the gate insulating layer 140 may be generated by etching a portion of the gate insulating layer 140 when firstly etching the data conductive layer 170, the ohmic contact layer 161, and the semiconductor layer 150 by using the photosensitive film pattern having the different thicknesses as the mask under the formation of the semiconductor 154, the ohmic contacts 163 and 165, and the data line 171 including the source electrode 173 and drain electrode 175.

Figure 11:
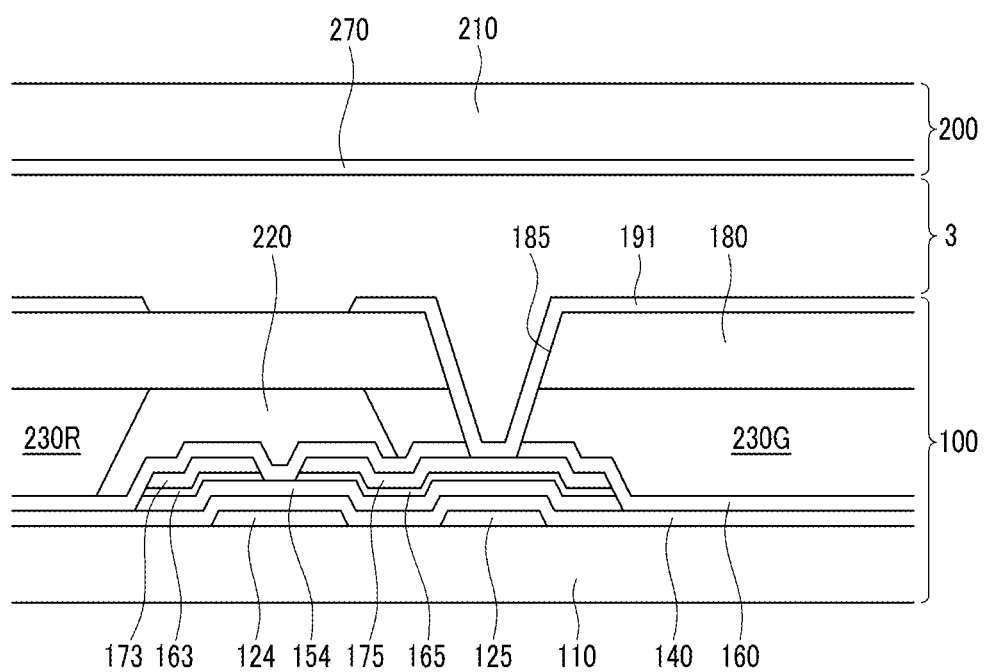
FIG. 11 is another cross-sectional view of the first exemplary embodiment of an LCD according to the present invention.

Alternative exemplary embodiments also include configurations, as shown in FIG. 11, wherein the contact hole 185 may be formed in the passivation layer 180, the color filters 230R, 230G, and 230B, and the blocking layer 160. In such an alternative exemplary embodiment, the color filters 230R, 230G, and 230B are expanded to the region wherein the pixel electrode 191 and the drain electrode 175 contact one another such that the photosensitive film (not shown) is coated on the passivation layer 180 and patterned using a mask to form a photosensitive film pattern when forming the contact hole 185. Next, the dry-etching is executed by using the photosensitive film pattern as the mask to form the first contact hole 185a. Next, the color filters 230R, 230G, and 230B and the blocking layer 160 are dry-etched by using the passivation layer 180 having the first contact hole 185a to form the second contact hole 185b, similar to the first exemplary embodiment described in detail above, with the exception that the contact hole 185 extends through the color filter instead of the light-blocking member.

<Second Exemplary Embodiment>

A second exemplary embodiment of an LCD according to the present invention will be described with reference to FIG. 12 to FIG. 15.

Figure 12:
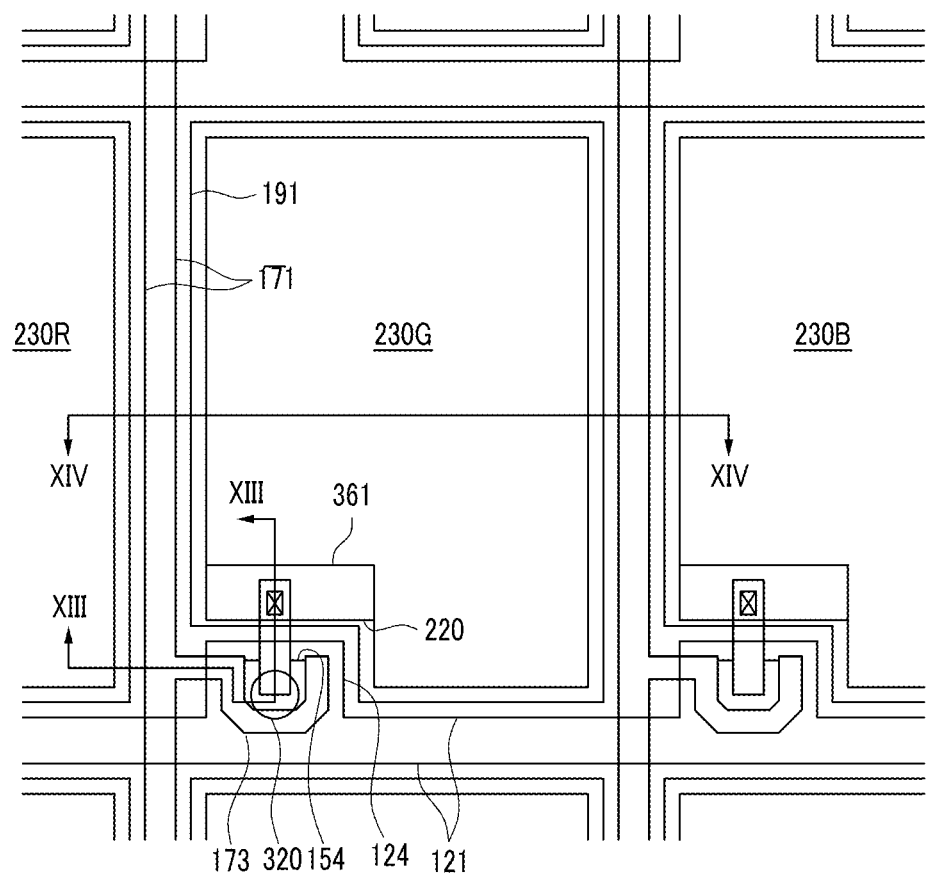
FIG. 12 is a top plan layout view of a second exemplary embodiment of an LCD according to the present invention.
Figure 13:
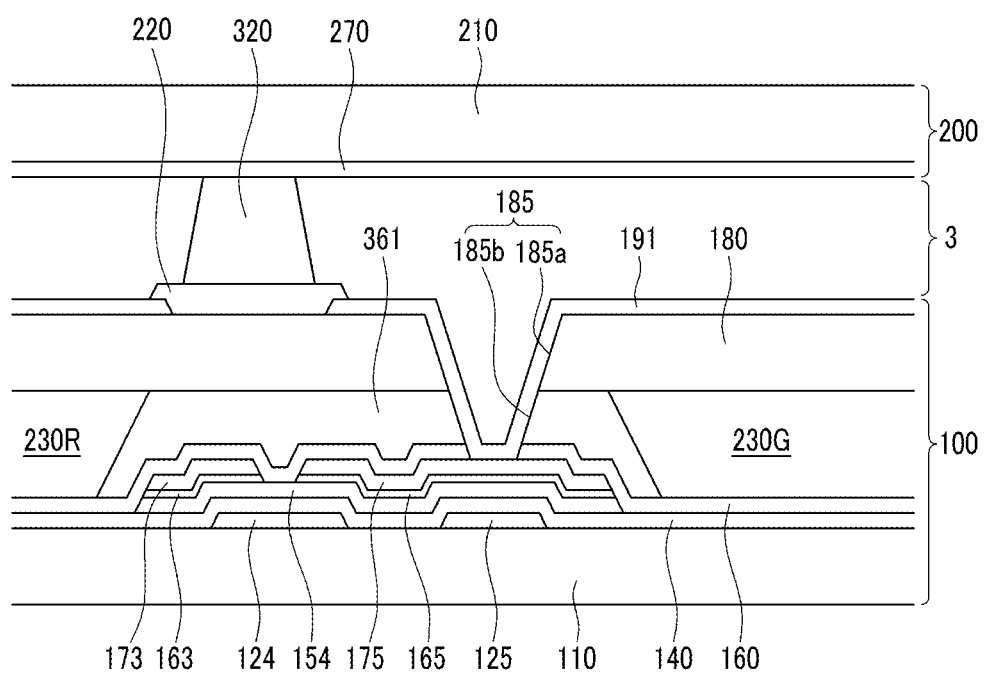
FIG. 13 is a cross-sectional view of the second exemplary embodiment of an LCD shown in FIG. 12 taken along line XIII-XIII.
Figure 14:
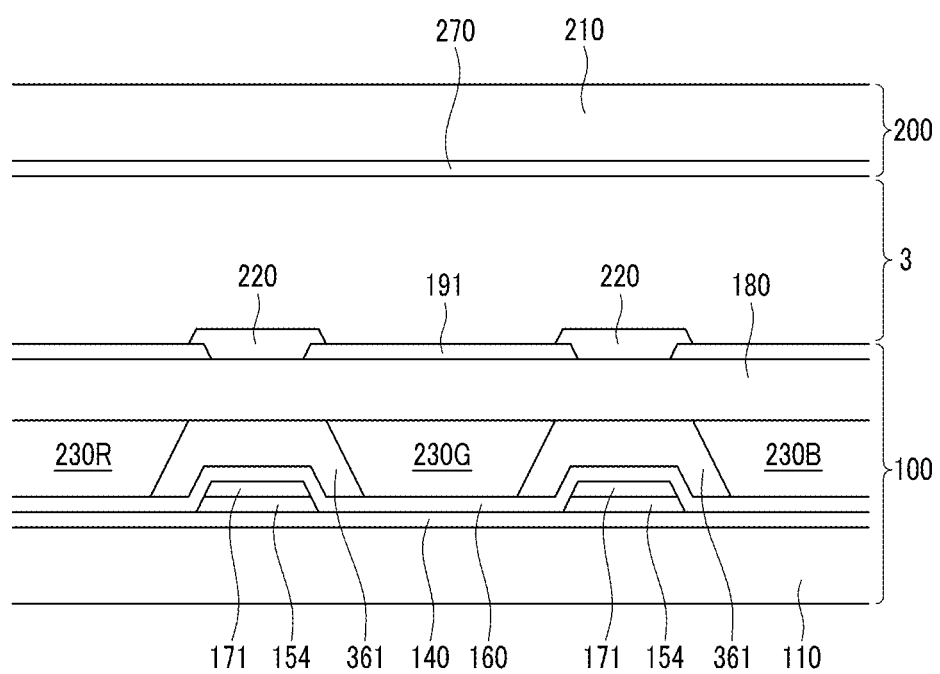
FIG. 14 is a cross-sectional view of the second exemplary embodiment of an LCD shown in FIG. 12 taken along line XIV-XIV.

FIG. 12 is a top plan layout view of second exemplary embodiment of an LCD according to the present invention, FIG. 13 is a cross-sectional view of the second exemplary embodiment of an LCD shown in FIG. 12 taken along line XIII-XIII, and FIG. 14 is a cross-sectional view of the second exemplary embodiment of an LCD shown in FIG. 12 taken along line XIV-XIV.

As shown in FIG. 12 to FIG. 14, the second exemplary embodiment of an LCD according to the present invention is similar to the first exemplary embodiment of an LCD.

However, a partition 361 is formed on a portion corresponding to the gate line 121, the data line 171, and the TFT on the blocking layer 160, and the color filters 230R, 230G, and 230B are formed in the pixel area defined by the partition 361. This is different from the first exemplary embodiment in that the partition 361 is substituted for the light-blocking member 220 in the present exemplary embodiment.

A passivation layer 180 is formed on the color filters 230R, 230G, and 230B, and the passivation layer 180, the partition 361, and the blocking layer 160 have the contact hole 185 including the first contact hole 185a and the second contact hole 185b exposing the drain electrode 175.

A pixel electrode 191 is formed on the passivation layer 180, and is connected to the drain electrode 175 through the contact hole 185.

A height increasing member 125 is disposed under the contact hole 185, and the length of the contact hole 185 is reduced by the height of the height increasing member 125. Particularly, the length of the contact hole 185b corresponding to the partition 361 is reduced. Also, in one exemplary embodiment, the height increasing member 125 may be disposed in a region totally enclosed by the boundary of the drain electrode 175.

The light-blocking member 220 is formed on the passivation layer 180 of the portion corresponding to the gate line 121 and data line 171, and a spacer 320 is formed on the light-blocking member 220. In one exemplary embodiment, the spacer 320 may be formed on the light-blocking member 220 by disposing a light-blocking layer on the passivation layer 180 and the pixel electrode, and exposing the light-blocking layer using a slit mask.

Figure 15:
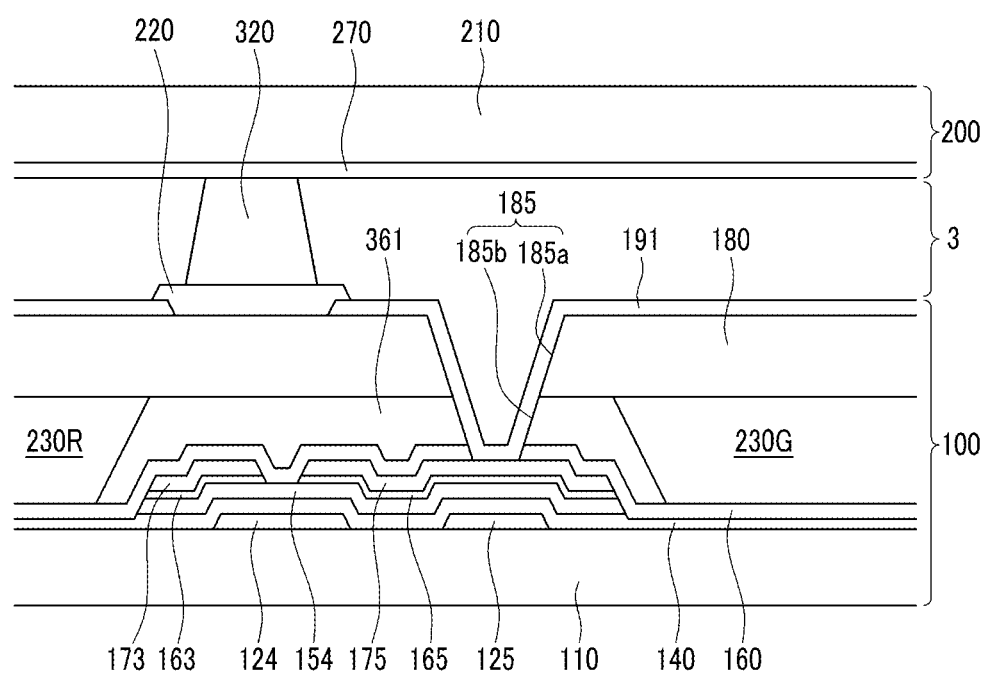
FIG. 15 is another cross-sectional view of the second exemplary embodiment of an LCD according to the present invention.

Exemplary embodiments also include configurations, as shown in FIG. 15, wherein the thickness of the gate insulating layer 140 may not be uniform. That is, the thickness of the gate insulating layer 140 covered by the semiconductor 154, the data line 171, and the drain electrode 175 is greater than at other areas. Accordingly, the length of the contact hole 185 is relatively reduced by the thickness difference of the gate insulating layer 140.

In one exemplary embodiment, the difference of the thickness of the gate insulating layer 140 may be generated by etching the portion of the gate insulating layer 140 when firstly etching the data conductive layer 170, the ohmic contact layer 161, and the semiconductor layer 150 by using the photosensitive film pattern having the different thicknesses as the mask under the formation of the semiconductor 154, the ohmic contacts 163 and 165, and the data line 171 including the source electrode 173 and drain electrode 175.

Figure 16:
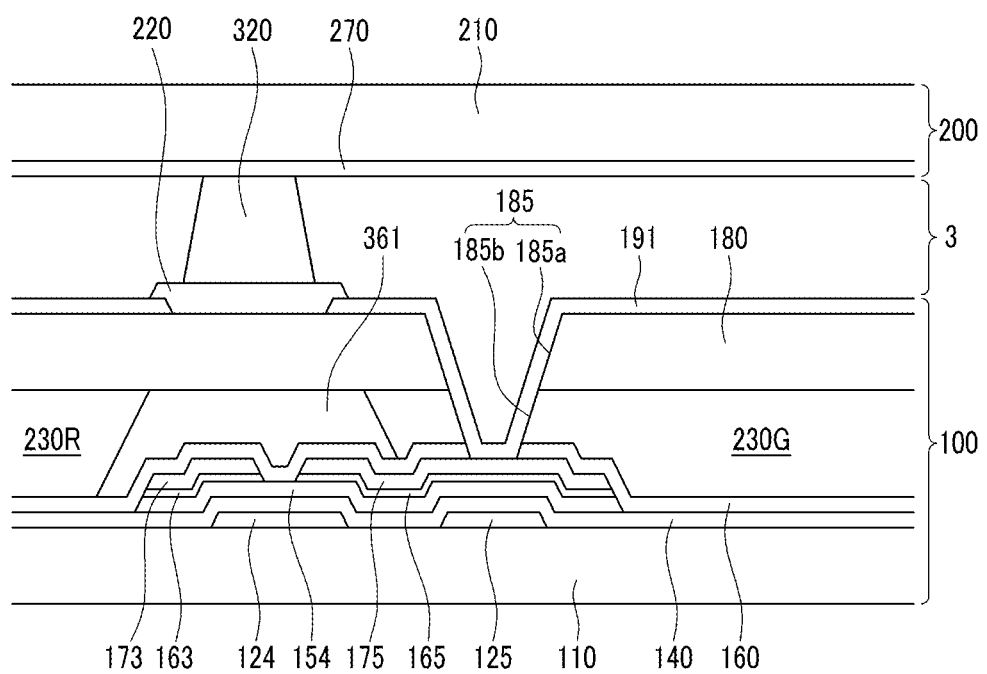
FIG. 16 is another cross-sectional view of the second exemplary embodiment of an LCD according to the present invention.

Exemplary embodiments also include configurations, as shown in FIG. 16, wherein a contact hole 185 may be formed through the passivation layer 180, the color filters 230R, 230G, and 230B, and the blocking layer 160. In such an exemplary embodiment, the color filters 230R, 230G, and 230B are expanded to the contact portion of the pixel electrode 191 and the drain electrode 175 such that the photosensitive film (not shown) is coated on the passivation layer 180 and patterned using a mask to form a photosensitive film pattern when forming the contact hole 185. Next, the dry-etching is executed by using the photosensitive film pattern as a mask to form the first contact hole 185a. Next, the dry-etching is executed using the passivation layer 180 having the first contact hole 185a to form the second contact hole 185b in the color filters 230R, 230G, and 230B and the blocking layer 160.

As discussed above, the present exemplary embodiment has been applied to the LCD, however, as would be apparent to one of ordinary skill in the art, the present invention may be applied to display devices of various kinds using TFTs.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a thin film transistor array panel, comprising:
    forming a gate line including a gate electrode and a height increasing member on a substrate;
    forming a gate insulating layer on the gate line and the height increasing member;
    forming a semiconductor, a data line including a source electrode disposed on the semiconductor, and a drain electrode facing the source electrode and disposed on the semiconductor, wherein the drain electrode overlaps at least a portion of the height increasing member;
    forming a first insulating layer on the gate insulating layer, the data line and the drain electrode;
    forming a light-blocking member on a portion of the first insulating layer corresponding to the semiconductor;
    forming a color filter in an area bound by the light-blocking member; and
    forming a pixel electrode disposed on the color filter and connected to the drain electrode through a contact hole disposed in the light-blocking member.

2. The method of claim 1, wherein the forming of the semiconductor, the data line including the source electrode, and the drain electrode facing the source electrode and overlapping at least the portion of the height increasing member on the gate insulating layer includes:
    etching the gate insulating layer that is not covered by the semiconductor, the data line, and the drain electrode to reduce the thickness of the gate insulating layer.

3. The method of claim 2, wherein the forming of the semiconductor, the data line including the source electrode, and the drain electrode facing the source electrode and overlapping at least the portion of the height increasing member on the gate insulating layer includes:
    sequentially depositing a semiconductor layer and a data conductive layer on the gate insulating layer;
    forming a photosensitive film pattern including a first portion and a second portion which is thicker than the first portion on the data conductive layer by using a slit mask;
    etching the semiconductor layer and the data conductive layer using the photosensitive film pattern as a mask;
    etching the gate insulating layer using the photosensitive film pattern as a mask to reduce the thickness of the gate insulating layer;
    ashing to remove the first portion of the photosensitive film pattern; and
    etching the portion of the data conductive layer and the semiconductor layer exposed by the removal of the first portion.

4. The method of claim 1, wherein the forming of the semiconductor, the data line including the source electrode, and the drain electrode facing the source electrode and overlapping at least the portion of the height increasing member on the gate insulating layer includes:
    etching the gate insulating layer that is not covered by the semiconductor, the data line, and the drain electrode to reduce the thickness of the gate insulating layer.

5. The method of claim 4, wherein the forming of the semiconductor, the data line including the source electrode, and the drain electrode facing the source electrode and overlapping at least the portion of the height increasing member on the gate insulating layer includes:
    sequentially depositing a semiconductor layer and a data conductive layer on the gate insulating layer;
    forming a photosensitive film pattern including a first portion and a second portion that is thicker than the first portion on the data conductive layer using a slit mask;
    etching the semiconductor layer and the data conductive layer using the photosensitive film pattern as a mask;
    etching the gate insulating layer using the photosensitive film pattern as a mask to reduce the thickness of the gate insulating layer;
    ashing to remove the first portion of the photosensitive film pattern; and
    etching the portion of the data conductive layer and the semiconductor layer exposed by the removal of the first portion.

6. The method of claim 1, further comprising:
    forming a second insulating layer on the light-blocking member and the color filter;
    patterning the second insulating layer, the light-blocking member, and the first insulating layer to form a contact hole exposing a portion of the drain electrode aligned with the height increasing member.

7. The method of claim 6, wherein the patterning of the second insulating layer, the light-blocking member, and the first insulating layer to form the contact hole exposing the portion of the drain electrode aligned with the height increasing member includes:
    forming a photosensitive film pattern on the second insulating layer;
    etching the second insulating layer using the photosensitive film pattern as a mask to form an upper portion of the contact hole; and
    etching the light-blocking member and the first insulating layer using the second insulating layer having the upper portion of the contact hole as a mask.

8. The method of claim 7, wherein the etching the second insulating layer and the etching the light-blocking member are executed by dry etching.

9. The method of claim 1, wherein a thickness of a first portion of the gate insulating layer which is covered by the semiconductor, the data line, and the drain electrode is greater than a thickness of a second portion of the gate insulating layer which is not covered by the semiconductor, the data line, and the drain electrode.

10. The method of claim 9, wherein the height increasing member is totally overlapped by the drain electrode.

11. The thin film transistor array panel of claim 10, wherein the semiconductor covers the height increasing member.

12. The method of claim 11, wherein the contact hole is aligned with the height increasing member.

13. The method of claim 1, wherein the semiconductor covers the height increasing member.

14. The method of claim 13, wherein the height increasing member is totally overlapped by the drain electrode.

15. The method of claim 14, wherein the contact hole is aligned with the height increasing member.

16. The method of claim 1, wherein the height increasing member is totally overlapped by the drain electrode.

17. The method of claim 16, wherein the contact hole is aligned with the height increasing member.

18. A thin film transistor array panel comprising:
    a substrate;
    a gate line including a gate electrode and a height increasing member disposed on the substrate;
    a gate insulating layer disposed on the gate line and the height increasing member;
    a semiconductor disposed on the gate insulating layer;

a data line including a source electrode disposed on the semiconductor, a drain electrode facing the source electrode and disposed on the semiconductor, and wherein the drain electrode overlaps at least a portion of the height increasing member;

a first insulating layer disposed on the gate insulating layer, the data line, and the drain electrode;

a light-blocking member disposed on a portion of the first insulating layer corresponding the semiconductor;

a color filter disposed in an area defined by the light-blocking member; and a pixel electrode disposed on the color filter and connected to the drain electrode through a contact hole, wherein the contact hole is disposed in the light-blocking member.

19. The thin film transistor array panel of claim 18, wherein a thickness of a first portion of the gate insulating layer which is covered by the semiconductor, the data line, and the drain electrode is greater than a thickness of a second portion of the gate insulating layer which is not covered by the semiconductor, the data line, and the drain electrode.

20. The thin film transistor array panel of claim 19, wherein the height increasing member is totally overlapped by the drain electrode.

21. The thin film transistor array panel of claim 20, wherein the semiconductor covers the height increasing member.

22. The thin film transistor array panel of claim 21, wherein the contact hole is aligned with the height increasing member.

23. The thin film transistor array panel of claim 18, wherein the semiconductor covers the height increasing member.

24. The thin film transistor array panel of claim 23, wherein the height increasing member is totally overlapped by the drain electrode.

25. The thin film transistor array panel of claim 24, wherein the contact hole is aligned with the height increasing member.

26. The thin film transistor array panel of claim 18, the height increasing member is totally overlapped by the drain electrode.

27. The thin film transistor array panel of claim 26, wherein the contact hole is aligned with the height increasing member.

* * * * *